United States Patent
Kuneshita (10) Patent No.: US 10,446,409 B2
(45) Date of Patent: Oct. 15, 2019

(54) METHOD OF MANUFACTURING SEMICONDUCTOR DEVICE

(71) Applicant: FUJI ELECTRIC CO., LTD., Kawasaki-shi, Kanagawa (JP)

(72) Inventor: Naoki Kuneshita, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/019,772

(22) Filed: Jun. 27, 2018

(65) Prior Publication Data
US 2019/0067029 A1 Feb. 28, 2019

(30) Foreign Application Priority Data
Aug. 29, 2017 (JP) ................. 2017-164811

(51) Int. Cl.
*H01L 21/31* (2006.01)
*H01L 21/76* (2006.01)
*H01L 21/311* (2006.01)
*H01L 21/768* (2006.01)

(52) U.S. Cl.
CPC ...... *H01L 21/31116* (2013.01); *H01L 21/768* (2013.01)

(58) Field of Classification Search
CPC ... H01L 21/76; H01L 21/768; H01L 21/7681; H01L 21/76816; H01L 21/7687; H01L 21/76877; H01L 21/31; H01L 21/311; H01L 21/3114; H01L 21/3111; H01L 21/31116; H01L 21/31144
USPC ........................................... 438/620
See application file for complete search history.

(56) References Cited

U.S. PATENT DOCUMENTS

| | | | |
|---|---|---|---|
| 4,753,709 A * | 6/1988 | Welch | H01L 21/76802 257/577 |
| 6,284,148 B1 | 9/2001 | Laermer et al. | |
| 2007/0013076 A1 | 1/2007 | Akiyama | |
| 2008/0211030 A1 | 9/2008 | Akiyama | |

FOREIGN PATENT DOCUMENTS

| | | |
|---|---|---|
| JP | 2001-505001 A | 4/2001 |
| JP | 2007-027343 A | 2/2007 |

\* cited by examiner

*Primary Examiner* — Monica D Harrison
(74) *Attorney, Agent, or Firm* — Rabin & Berdo, P.C.

(57) ABSTRACT

An interlayer insulating film is dry etched using a $CHF_3$ gas and by using, as a mask, a resist film having a first opening and a second opening that is wider than the first opening, thereby forming a first contact hole of a predetermined depth in the first opening and forming a second contact hole in the second opening. The gas in a furnace is switched to a $C_4F_8$ gas and the first contact hole is embedded with a polymer by the $C_4F_8$ gas. The gas in the furnace is switched to a $CHF_3$ gas. With the first contact hole protected by the polymer, the interlayer insulating film is dry etched using the same resist film as a mask, making a depth of the second contact hole a predetermined depth deeper than that of the first contact hole. Thereafter, the resist film and the polymer are removed.

9 Claims, 9 Drawing Sheets

METHOD OF MANUFACTURING SEMICONDUCTOR DEVICE

CROSS REFERENCE TO RELATED APPLICATIONS

This application is based upon and claims the benefit of priority of the prior Japanese Patent Application No. 2017-164811, filed on Aug. 29, 2017, the entire contents of which are incorporated herein by reference.

BACKGROUND OF THE INVENTION

1. Field of the Invention

Embodiments of the invention relate to a method of manufacturing a semiconductor device.

2. Description of the Related Art

Semiconductor devices having a poly-silicon (poly-Si) diode, such as for a temperature sensor, provided via an insulating layer, on a front surface of a semiconductor substrate (semiconductor chip) that has a metal oxide semiconductor field effect transistor (MOSFET) or an insulated gate bipolar transistor (IGBT) with a trench gate structure are conventionally known.

Generally, a common method of forming a contact hole for a contact (electrical contact) with an electrode layer is to perform dry etching using a resist film as a mask to selectively remove an oxide film that covers a front surface of a semiconductor substrate. A contact hole is a groove that reaches a silicon (Si) region such as an emitter region or a poly-silicon layer such as a gate electrode, etc. An oxide film has a high selection ratio with silicon and poly-silicon and therefore, etching of the oxide film ceases substantially at the surface of the silicon or poly-silicon. As a result, a favorable contact may be formed between the silicon region or poly-silicon layer and the electrode layer.

For a semiconductor device having plural elements such as the described IGBT, MOSFET, poly-silicon diode, etc. on a single semiconductor substrate, for example, when a contact hole for the poly-silicon diode; a contact hole for forming at the front surface of the semiconductor substrate, a contact with a silicon region; and a contact hole for a contact with a gate electrode embedded in a trench are formed, depths of the contact holes differ. However, when plural contact holes are formed in an oxide film by dry etching, usually, etching depths of all of the contact holes are substantially equal.

To concurrently form plural contact holes having differing depths, for example, when etching is performed based on etching conditions for a contact hole having a relatively deep depth, for example, a contact hole for the poly-silicon diode, which has a relatively shallow depth, penetrates through the poly-silicon diode. Further, when etching is performed based on etching conditions for a contact hole having a relatively shallow depth, a contact hole that is to have a relatively deep depth does not reach the predetermined depth. Therefore, contact holes having differing depths are each formed by a different etching process.

When plural contact holes having differing depths are formed by respectively different etching processes, before the etching processes, a photolithography process for forming an etching mask is performed. When such a photolithographic process is performed two or more times, in the second and subsequent photolithographic processes, a resist film is embedded in all of the contact holes already formed. Therefore, after removal of the resist film, residue (resist residue) of the resist film remains in the contact holes. The resist residue is a factor that causes a poor contact to be created and therefore, is undesirable.

Recently, in power devices, device structures that facilitate improvement of characteristics, such as breakdown capability, by forming a contact (hereinafter, trench contact) between an electrode layer and a silicon region at an inner wall of a trench have been proposed. These power devices also have a mixture of contact holes for a trench contact and for a poly-silicon diode. The contact hole for the trench contact penetrates an interlayer insulating film in a depth direction and terminates in the semiconductor substrate. Thus, the contact holes have depths that differ greatly and as described, are each formed by a different etching process.

On the other hand, according to a commonly known etching method called a Bosch process, in dry etching a silicon region to form a trench, to protect side walls of the trench at the time of the dry etching, a reaction product (a so-called polymer) generated by a constituent included in a gas that is supplied during the dry etching is grown on an inner wall of the trench while the trench is etched (for example, refer to Published Japanese-Translation of PCT Application, Publication No. 2001-505001). In the Bosch process, a process of etching a silicon region by a fluorine (F) radical such as sulfur hexafluoride ($SF_6$) and a process of using octafluorocyclobutane ($C_4F_8$) gas, etc. to deposit a polymer on the side walls of the trench and thereby protect the side walls are alternately performed repeatedly, whereby a high aspect ratio trench may be formed quickly.

Figure 9:
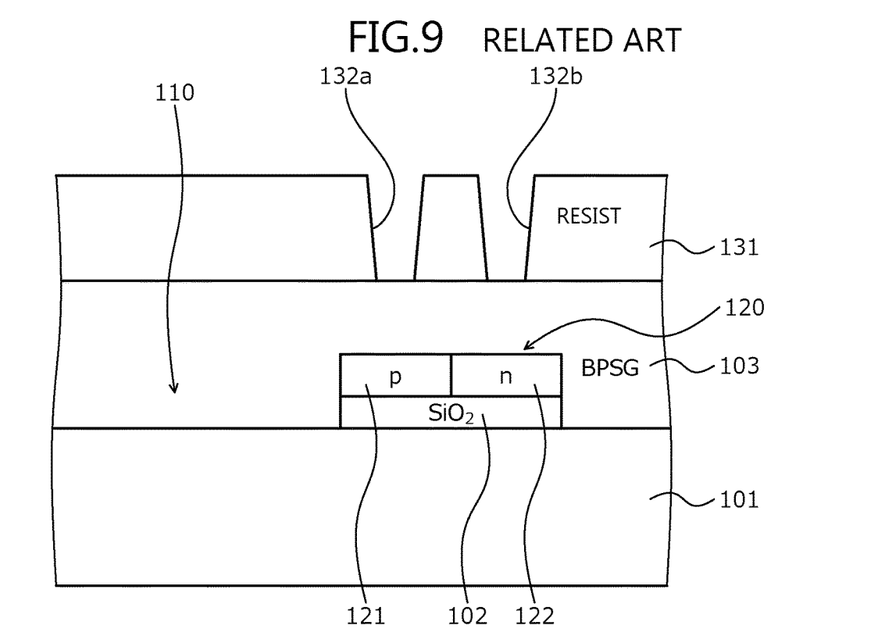
FIG. 9 is a cross-sectional view of a conventional semiconductor device during manufacture.

A method of manufacturing a conventional semiconductor device by a Bosch process will be described taking, as an example, a semiconductor device having a poly-silicon diode 120 provided via an insulating layer 102, on a semiconductor substrate 101 that has a trench gate type IGBT 110 in which a contact with an emitter electrode is formed by a contact hole 137 for a trench contact. FIGS. 9, 10, 11, 12, 13, 14, and 15 are cross-sectional views of the conventional semiconductor device during manufacture. First, as depicted in FIG. 9, at a front surface side of the semiconductor substrate 101, a MOS gate region (not depicted) of the trench gate type IGBT 110 is formed. Next, on a front surface of the semiconductor substrate 101, the insulating layer 102 containing silicon oxide ($SiO_2$), etc. is selectively formed.

Next, on the insulating layer 102, poly-silicon layers 121, 122 constituting a p-type anode layer and an n-type cathode layer of the poly-silicon diode 120 are formed. Next, an interlayer insulating film 103 containing a borophosphosilicate glass (BPSG), etc. is formed on the entire front surface of the semiconductor substrate 101 so as to cover the poly-silicon layers 121, 122 and a gate electrode (not depicted) of the trench gate type IGBT 110. Next, the interlayer insulating film 103 is planarized by heat treatment (reflow), chemical mechanical polishing (CMP), etc.

Figure 10:
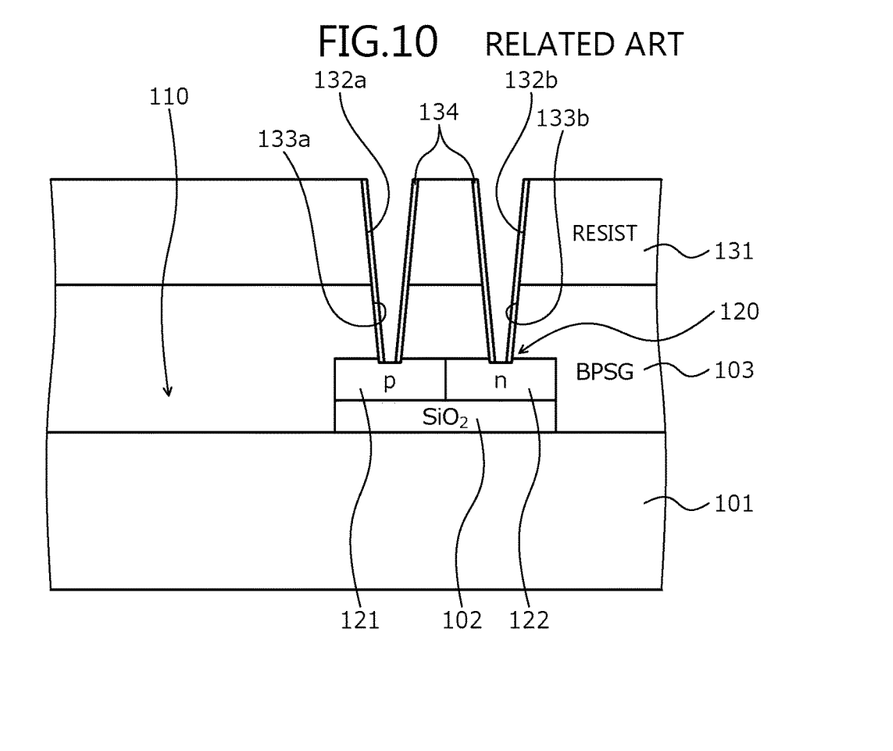
FIG. 10 is a cross-sectional view of the conventional semiconductor device during manufacture.

Next, on the interlayer insulating film 103, a resist film 131 that has openings at parts corresponding to formation regions of an anode contact and a cathode contact of the poly-silicon diode 120 is formed. Reference characters 132*a* and 132*b* are the openings in the resist film 131 corresponding to the formation regions of the anode contact and the cathode contact. Next, as depicted in FIG. 10, using the resist film 131 as a mask, dry etching is performed using trifluoromethane ($CHF_3$) gas, etc., thereby forming contact holes 133a, 133b that penetrate the interlayer insulating film 103 in the depth direction and reach the poly-silicon layers 121, 122, respectively.

The dry etching for forming the contact holes 133a, 133b is by a Bosch process of alternately repeating an etching process of selectively removing the interlayer insulating film 103 and increasing depths of the contact holes 133a, 133b, and a deposition process of depositing a polymer on side walls of the contact holes 133a, 133b and protecting the side walls of the contact holes 133a, 133b. Therefore, even at the moment that a predetermined depth of the contact holes 133a, 133b is obtained, a protecting film 134 formed by the polymer remains at the side walls of the contact holes 133a, 133b and the openings 132a, 132b of the resist film 131.

Figure 11:
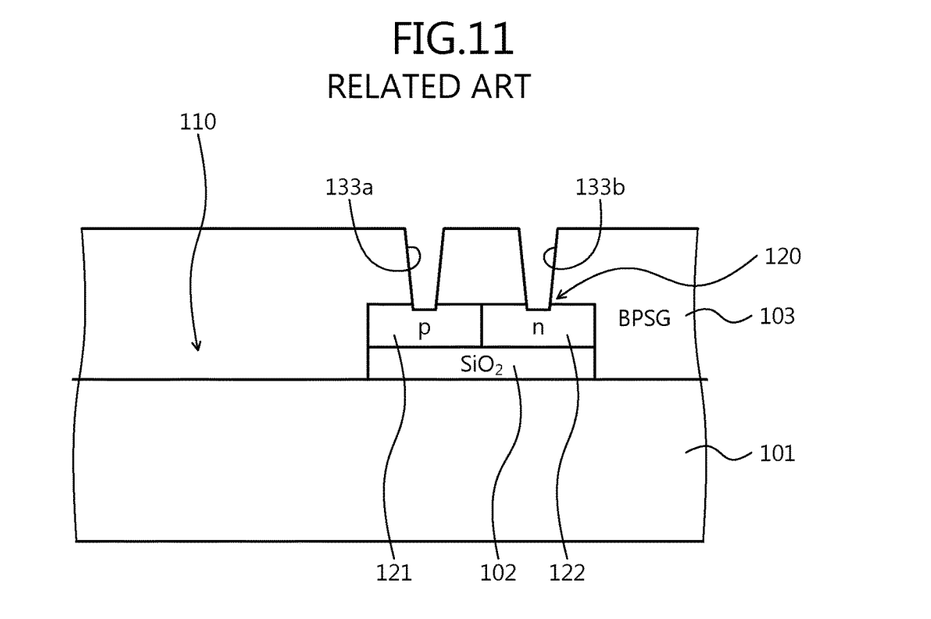
FIG. 11 is a cross-sectional view of the conventional semiconductor device during manufacture.
Figure 12:
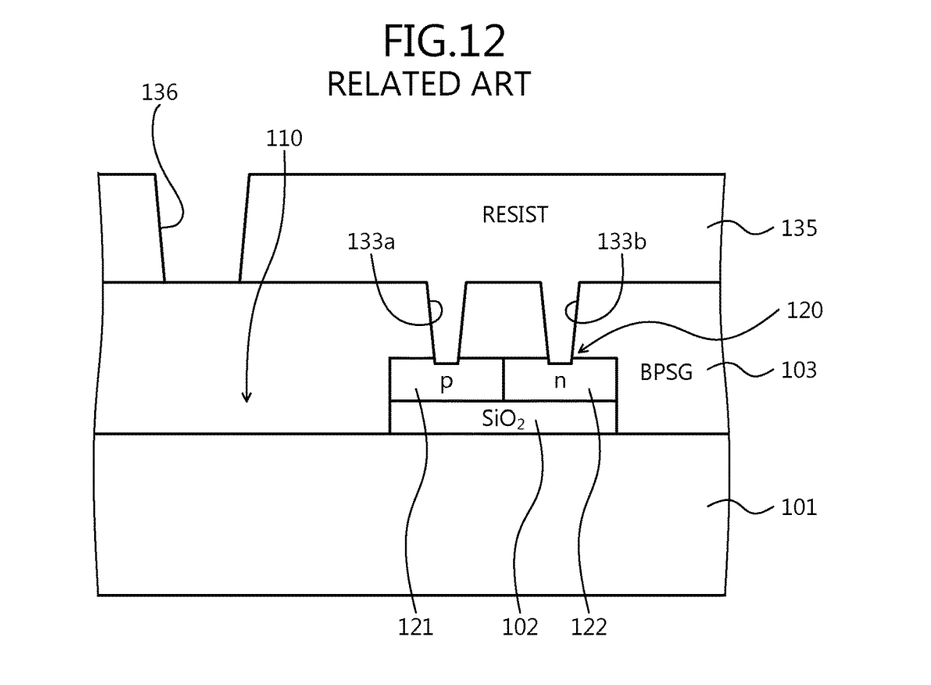
FIG. 12 is a cross-sectional view of the conventional semiconductor device during manufacture.

Next, as depicted in FIG. 11, after the resist film 131 is removed, the protecting film 134 formed by the polymer is removed. Next, as depicted in FIG. 12, on the interlayer insulating film 103, a resist film 135 having an opening at a part corresponding to a formation region of a trench contact of the trench gate type IGBT 110 is formed. Reference numeral 136 is an opening in the resist film 135 corresponding to the formation region of a trench contact. At this time, the resist film 135 is embedded in the contact holes 133a, 133b of the interlayer insulating film 103.

Figure 13:
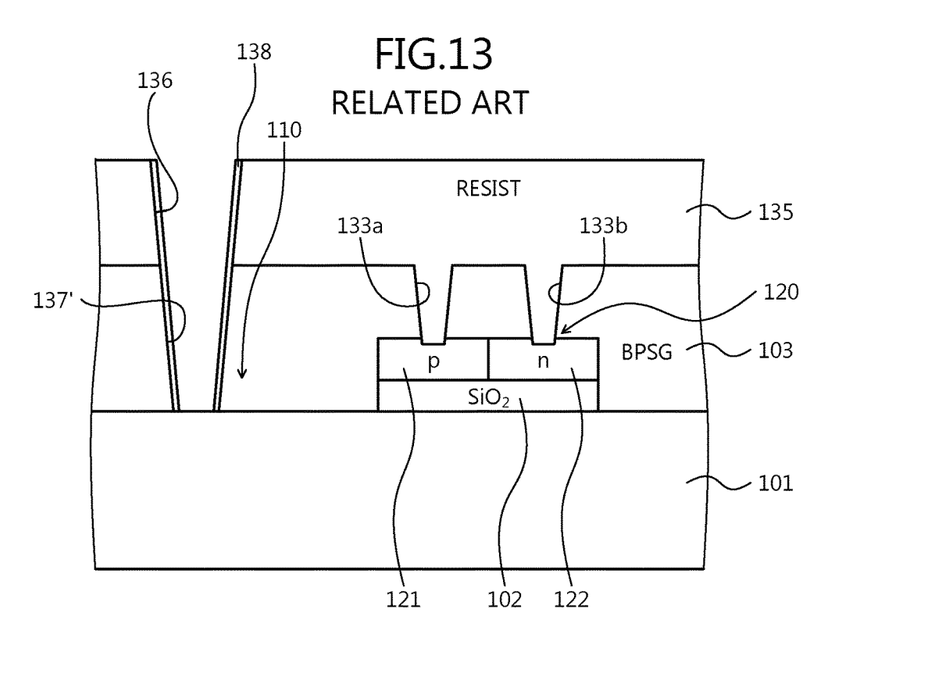
FIG. 13 is a cross-sectional view of the conventional semiconductor device during manufacture.

Next, as depicted in FIG. 13, using, as a mask, the resist film 135 formed at a different time from the contact holes 133a, 133b, dry etching is performed using $CHF_3$ gas, etc., whereby the interlayer insulating film 103 is selectively removed, forming a contact hole 137'. After a depth of the contact hole 137' reaches the front surface of the semiconductor substrate 101, the gas species supplied to the chamber (furnace) is changed to $C_4F_8$ gas, etc.

Figure 14:
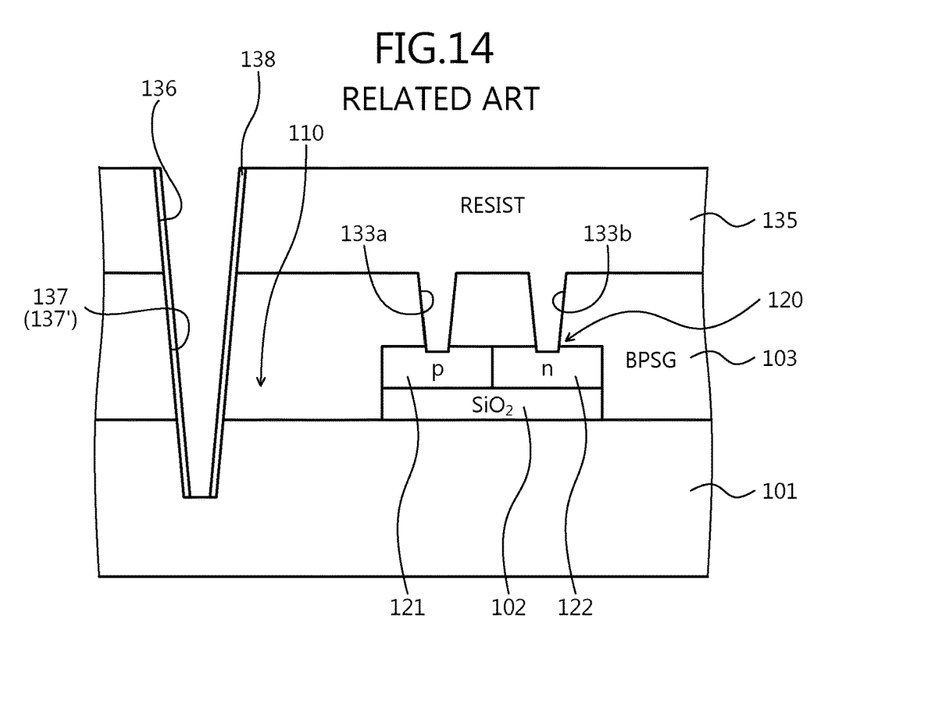
FIG. 14 is a cross-sectional view of the conventional semiconductor device during manufacture.
Figure 15:
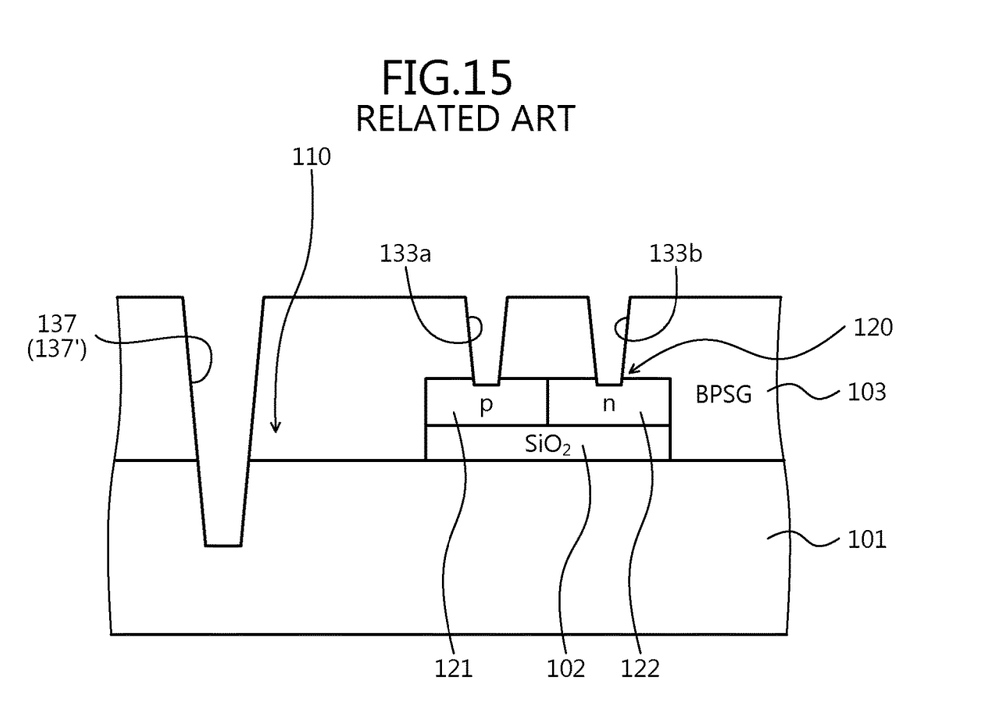
FIG. 15 is a cross-sectional view of the conventional semiconductor device during manufacture.

As depicted in FIG. 14, dry etching is further performed using the resist film 135 as a mask and by the Bosch process, the semiconductor substrate 101 (silicon region) is selectively removed, increasing a depth of the contact hole 137', whereby the contact hole 137 for the trench contact is formed. At the time point that the contact hole 137 for the trench contact is formed, a protecting film 138 formed by the polymer remains at side walls of the opening 136 of the resist film 135 and the contact hole 137 for the trench contact. Next, as depicted in FIG. 15, the resist film 135 is removed.

By the processes up to here, the contact holes 133a, 133b, 137 having differing depths are formed. Thereafter, electrode layers (not depicted) constituting an anode electrode and a cathode electrode are embedded in the contact holes 133a, 133b, respectively, whereby an anode contact and a cathode contact are formed. An electrode layer (not depicted) constituting the emitter electrode is embedded in the contact hole 137, whereby an emitter contact is formed at side walls of the contact hole 137. A collector region and a collector electrode are formed at a rear surface of the semiconductor substrate 101, completing the semiconductor device.

As a method of concurrently forming plural contact holes having differing depths, a method has been proposed in which in the formation of contact holes for a silicon region and a gate electrode of a planar gate type MOSFET, three layers of differing materials and constituting insulating films are sequentially deposited so as to cover the gate electrode and then, the three layers constituting insulating films are individually dry etched by switching the etching gas according to the material of each layer (for example, refer to Japanese Laid-Open Patent Publication No. 2007-027343 (paragraphs 0015 to 0018, FIGS. 5 to 8)).

SUMMARY OF THE INVENTION

According to an embodiment, a method of manufacturing a semiconductor device having a plurality of contact holes of differing depths, includes forming an interlayer insulating film on a semiconductor substrate; forming on the interlayer insulating film, a resist film having a first opening and a second opening having a width that is wider than a width of the first opening; using the resist film as a mask to dry etch the interlayer insulating film, forming at a part of the interlayer insulating film exposed at the first opening, a first contact hole having a first predetermined depth and forming at a part of the interlayer insulating film exposed at the second opening, a second contact hole; depositing a reaction product produced by a constituent included in a first gas, so as to embed the first contact hole with the reaction product; using the resist film as a mask to dry etch the interlayer insulating film with the first contact hole protected by the reaction product, making a depth of the second contact hole a second predetermined depth that is deeper than the first predetermined depth of the first contact hole; removing the resist film; and removing the reaction product and exposing the first contact hole.

In the embodiment, the method further includes switching a second gas in a furnace containing the semiconductor substrate to the first gas after forming the first contact hole and the second contact hole and before depositing the reaction product.

In the embodiment, the method further includes switching the first gas in the furnace to a third gas after depositing the reaction product and before making the depth of the second contact hole the second predetermined depth.

In the embodiment, the second gas and the third gas are a same gas species.

In the embodiment, forming the first contact hole and the second contact hole includes dry etching the interlayer insulating film using a mixed gas containing the first gas; depositing the reaction product includes depositing the reaction product produced by the constituent contained in the mixed gas; and making the depth of the second contact hole the second predetermined depth includes dry etching the interlayer insulating film using the mixed gas.

In the embodiment, forming the first contact hole and the second contact hole includes making the first predetermined depth of the first contact hole a depth that reaches a surface of a poly-silicon layer disposed on the semiconductor substrate. The method further includes forming in the first contact hole, a first electrode layer that forms a contact with the poly-silicon layer, the first electrode layer being formed after removing the reaction product and exposing the first contact hole.

In the embodiment, making the depth of the second contact hole the second predetermined includes making the second predetermined depth of the second contact hole a depth that reaches a surface of the semiconductor substrate. The method further includes forming in the second contact hole, a second electrode layer that forms a contact with the semiconductor substrate, the second electrode layer being formed after removing the reaction product and exposing the first contact hole.

In the embodiment, the method further includes using the resist film as a mask to dry etch the semiconductor substrate after making the depth of the second contact hole the second predetermined depth and before removing the resist film, further increasing the depth of the second contact hole, wherein forming the second electrode layer includes forming at a side wall of the second contact hole, a contact of the semiconductor substrate and the second electrode layer.

Objects, features, and advantages of the present invention are specifically set forth in or will become apparent from the following detailed description of the invention when read in conjunction with the accompanying drawings.

DETAILED DESCRIPTION OF THE INVENTION

First, problems associated with the related arts will be discussed. As described, two sessions of the photolithographic process are necessary for forming each of the resist films 131, 135 used as masks in the etching for forming the contact holes 133a, 133b, 137', which have differing depths. One session of the photolithographic process, for example, requires about 1 hour, whereby a problem arises in that the lead time increases. Further, material costs and processing costs of the resist films 131, 135 increase, leading to a problem in that overall cost increases.

Embodiments of a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
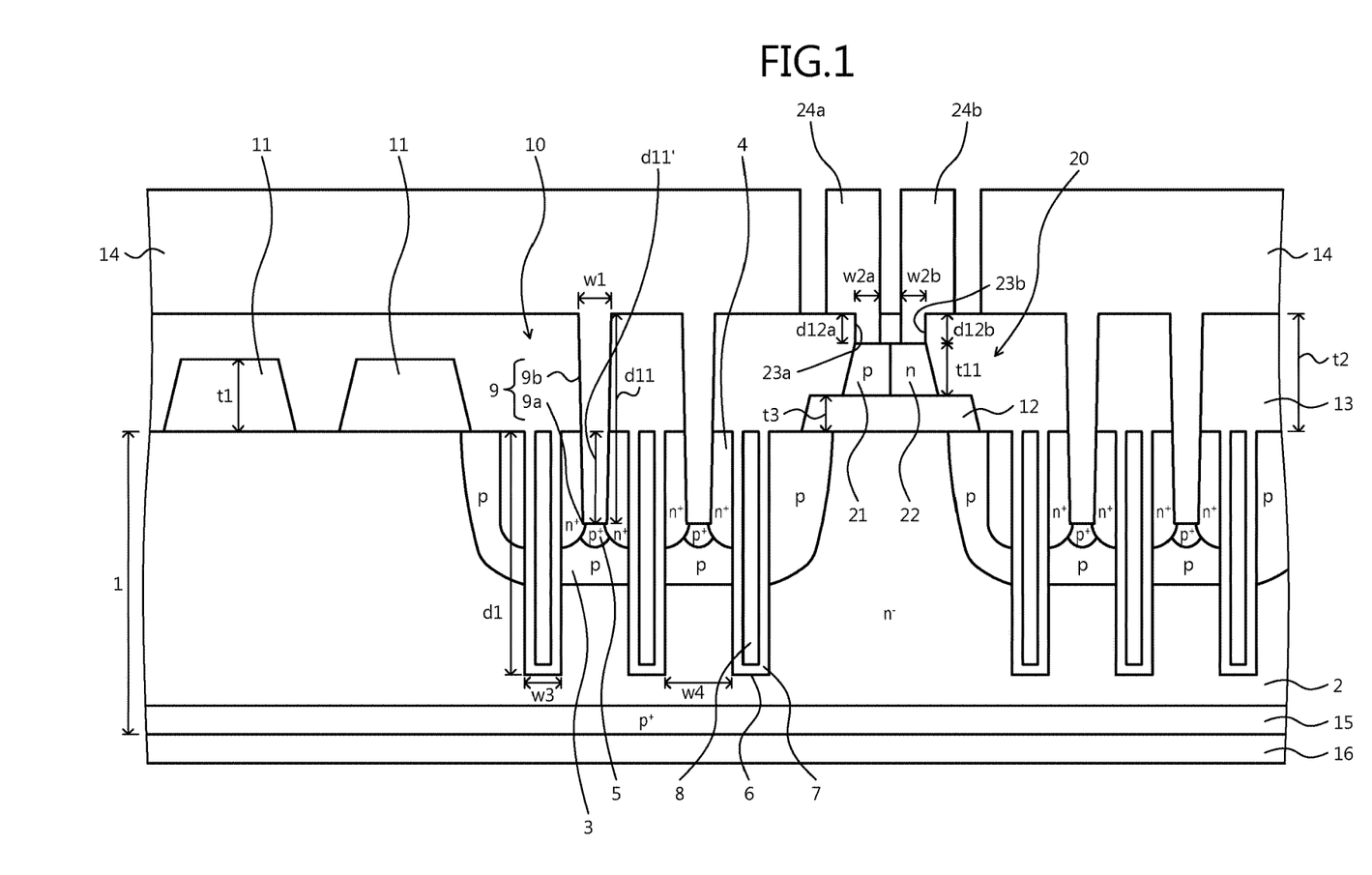
FIG. 1 is a cross-sectional view of an example of a semiconductor device manufactured by a method of manufacturing a semiconductor device according to an embodiment.

First, an example of a semiconductor device fabricated (manufactured) by the method of manufacturing a semiconductor device according to the embodiment will be described. FIG. 1 is a cross-sectional view of an example of a semiconductor device manufactured by the method of manufacturing a semiconductor device according to the embodiment. A semiconductor device according to the embodiment depicted in FIG. 1 includes a poly-silicon diode 20 provided, via an insulating layer 12, on a semiconductor substrate 1 that has a trench gate type IGBT 10 in which a contact between a silicon (Si) region and an emitter electrode 14 is formed by a contact hole 9 for a trench contact.

The trench gate type IGBT 10 includes at front surface side of the semiconductor substrate 1, a MOS gate region constituted by a p-type base region 3, an $n^+$-type emitter region 4, a $p^+$-type contact region 5, a trench (gate trench) 6, a gate insulating film 7, and a gate electrode 8. The p-type base region 3 is selectively provided in a surface layer at a front surface of the semiconductor substrate 1. A part of the semiconductor substrate 1 other than the p-type base region 3 and a $p^+$-type collector region 15 described hereinafter is an $n^-$-type drift region 2. In the p-type base region 3, the $n^+$-type emitter region 4 and the $p^+$-type contact region 5 are selectively provided in a surface layer at the front surface side of the semiconductor substrate 1.

The gate trench 6 penetrates the $n^+$-type emitter region 4 and the p-type base region 3, and reaches the $n^-$-type drift region 2. A width w3 of the gate trench 6 may be, for example, about 1.5 μm or less. A depth d1 of the gate trench 6 may be in a range from 5 μm to 6 μm. The gate insulating film 7 is provided along an inner wall of the gate trench 6. The gate electrode 8 is provided in the gate trench 6, on the gate insulating film 7. The gate electrode 8 opposes the $n^+$-type emitter region 4 across the gate insulating film 7 at a side wall of the gate trench 6. The gate electrode 8 may be formed using, for example, poly-silicon (poly-Si).

Between adjacent gate trenches 6 (mesa region), a trench (emitter trench) 9a is provided separated from the gate trench 6. A distance w4 between the adjacent gate trenches 6 may be, for example, about 5 μm or less. A depth d11' of the emitter trench 9a is shallower than depths of the $n^+$-type emitter region 4 and the $p^+$-type contact region 5. At a side wall of the emitter trench 9a, the $n^+$-type emitter region 4 is exposed, and at a bottom of the emitter trench 9a, the $p^+$-type contact region 5 is exposed. The emitter trench 9a constitutes the later-described contact hole 9 for a trench contact. A periphery of the MOS gate region of the trench gate type IGBT 10 is surrounded by a field oxide film 11.

The field oxide film 11 is provided on the front surface of the semiconductor substrate 1. The field oxide film 11 may be, for example, LOCOS (local oxidation of silicon) film. A thickness t1 of the field oxide film 11 may be, for example, in a range from about 400 nm to 600 nm. On the front surface of the semiconductor substrate 1, an interlayer insulating film 13 is provided so as to cover the gate electrode 8, the field oxide film 11, the insulating layer 12, and the poly-silicon diode 20. The interlayer insulating film 13 may be formed using, for example, BPSG, etc. A thickness t2 of the interlayer insulating film 13 may be, for example, in a range from about 800 nm to 1200 nm.

At a part of the interlayer insulating film 13 opposing the emitter trench 9a, a contact hole 9b that penetrates the interlayer insulating film 13 in a depth direction and reaches the semiconductor substrate 1 is provided. The depth direction is a direction from the front surface of the semiconductor substrate 1 toward a rear surface thereof. The contact hole 9b is contiguous with the emitter trench 9a and constitutes the contact hole 9 for a trench contact. A width of the contact hole 9b(=width w1 of the contact hole 9 for a trench contact) is, for example, substantially equal to a width of the emitter trench 9a; and side walls of the contact hole 9b and of the emitter trench 9a are substantially flush.

When the contact hole 9 is formed in a striped layout as viewed from the front surface side of the semiconductor substrate 1, the width w1 of the contact hole 9 is a length in a lateral direction of the contact hole 9. When the contact hole 9 is formed in a matrix layout as viewed from the front surface side of the semiconductor substrate 1, the width w1 of the contact hole 9 is a diameter (contact diameter) of the contact hole 9 when the contact hole 9 has a substantially circular planar shape, and is a length of each side of the contact hole 9 when the contact hole 9 has a substantially rectangular planar layout. Widths w2a, w2b of contact holes 23a, 23b described hereinafter are similarly defined.

The width w1 of the contact hole 9 toward an opening of the contact hole 9 (opposite a bottom of the contact hole 9) may be, for example, in a range from about 0.9 µm to 1.1 µm. The contact hole 9 for a trench contact may have a substantially rectangular cross-sectional shape in which the width w1 is constant from the opening toward the bottom, or may have a substantially trapezoidal cross-sectional shape in which the width decreases from the opening toward the bottom, etc. Further, on the front surface of the semiconductor substrate 1, the insulating layer 12 is provided. The insulating layer 12 may be constituted by, for example, the field oxide film 11. A thickness t3 of the insulating layer 12 may be, for example, about 200 nm or more.

On the insulating layer 12, a p-type poly-silicon layer 21 and an n-type poly-silicon layer 22 are provided in parallel along a direction parallel to the front surface of the semiconductor substrate 1. The p-type poly-silicon layer 21 and the n-type poly-silicon layer 22 are in contact with each other. A thickness t11 of the p-type poly-silicon layer 21 and the n-type poly-silicon layer 22 may be, for example, in a range from about 400 nm to 600 nm. At a pn junction of the p-type poly-silicon layer 21 constituting a p-type anode layer and the n-type poly-silicon layer 22 constituting an n-type cathode layer, the poly-silicon diode 20 is formed. The poly-silicon diode 20, for example, may be used as a diode for a temperature sensor, or may be used as wiring for gate resistance and electrical characteristics evaluation, etc.

The poly-silicon diode 20 (the p-type poly-silicon layer 21 and the n-type poly-silicon layer 22) and the insulating layer 12 are covered by the interlayer insulating film 13 as described above. The contact holes 23a, 23b that penetrate the interlayer insulating film 13 in the depth direction and respectively reach the p-type poly-silicon layer 21 and the n-type poly-silicon layer 22 are provided at parts of the interlayer insulating film 13 respectively opposing the p-type poly-silicon layer 21 and the n-type poly-silicon layer 22. The contact holes 23a, 23b are respectively a contact hole for an anode contact and a contact hole for a cathode contact of the poly-silicon diode 20. At bottoms of the contact holes 23a, 23b, the p-type poly-silicon layer 21 and the n-type poly-silicon layer 22 are exposed, respectively.

The widths w2a, w2b of the contact holes 23a, 23b for the poly-silicon diode 20 are narrower than the width w1 of the contact hole 9 of the trench gate type IGBT 10. The widths w2a, w2b of the contact holes 23a, 23b for the poly-silicon diode 20 are determined based on a respective depth d12a, d12b of the contact hole 23a, 23b and a depth d11 of the contact hole 9 of the trench gate type IGBT 10. The widths w2a, w2b of the contact holes 23a, 23b for the poly-silicon diode 20 may be, for example, in a range from about 0.4 µm to 0.6 µm. Respective depths d12a, d12b of the contact holes 23a, 23b for the poly-silicon diode 20 are shallower than the depth d11 of the contact hole 9 of the trench gate type IGBT 10.

On the interlayer insulating film 13, the emitter electrode (second electrode layer) 14, an anode electrode (first electrode layer) 24a, and a cathode electrode (first electrode layer) 24b are provided separated from each other. The emitter electrode 14 is embedded in the contact hole 9 for a trench contact and at an inner wall of the emitter trench 9a constituting the contact hole 9, the emitter electrode 14 is in contact with the $n^+$-type emitter region 4 and the $p^+$-type contact region 5 and is electrically connected with the $n^+$-type emitter region 4 and the $p^+$-type contact region 5. At the inner wall of the emitter trench 9a, an emitter contact of silicon regions (the $n^+$-type emitter region 4 and the $p^+$-type contact region 5) and the emitter electrode 14 is formed.

The anode electrode 24a is embedded in the contact hole 23a for the poly-silicon diode 20 and at the bottom of the contact hole 23a, is in contact with the p-type poly-silicon layer 21. At the bottom of the contact hole 23a, an anode contact of the p-type poly-silicon layer 21 and the anode electrode 24a is formed. The cathode electrode 24b is embedded in the contact hole 23b for the poly-silicon diode 20 and at the bottom of the contact hole 23b, is in contact with the n-type poly-silicon layer 22. At the bottom of the contact hole 23b, a cathode contact of the n-type poly-silicon layer 22 and the cathode electrode 24b is formed. In the contact holes 23a, 23b, a tungsten plug may be embedded via a barrier metal layer (not depicted).

The $p^+$-type collector region 15 is provided in a surface layer at the rear surface of the semiconductor substrate 1. A collector electrode 16 is provided on the entire rear surface of the semiconductor substrate 1. The collector electrode 16 is in contact with the $p^+$-type collector region 15 at the rear surface of the semiconductor substrate 1 and is electrically connected with the $p^+$-type collector region 15.

Figure 2:
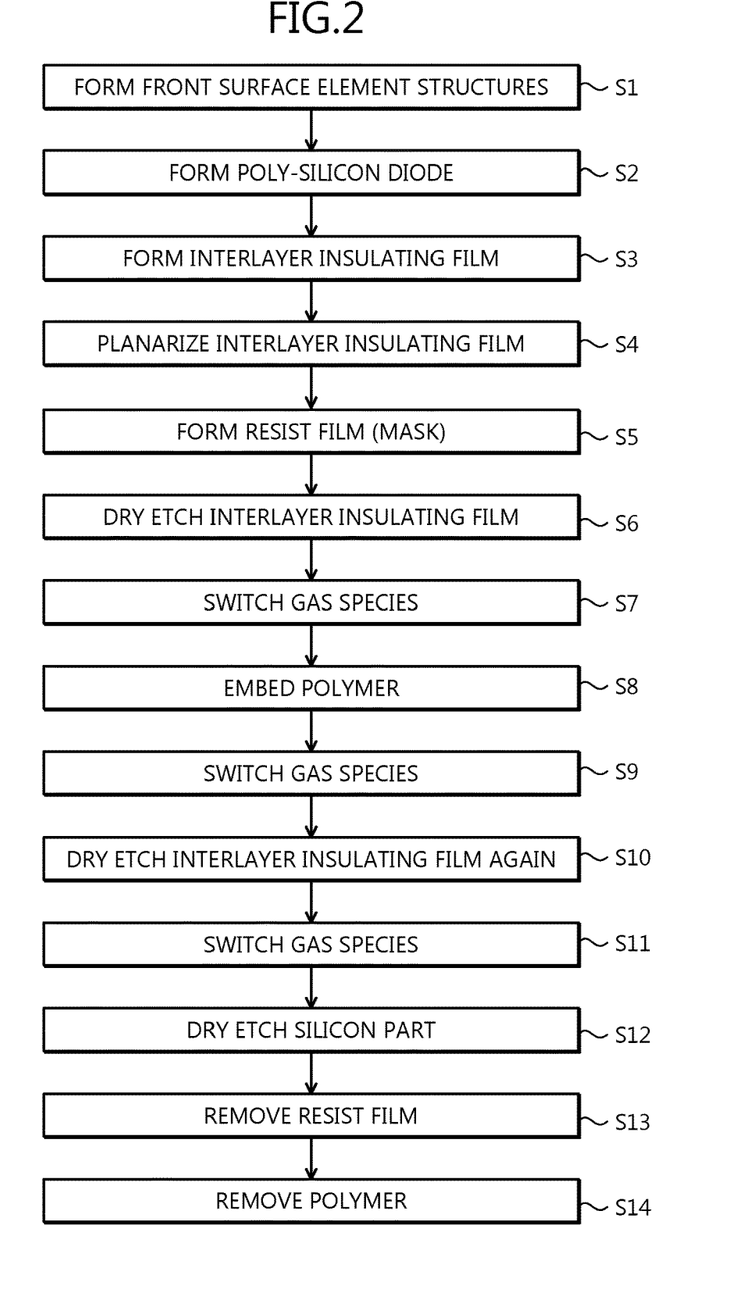
FIG. 2 is a flowchart depicting an outline of the method of manufacturing the semiconductor device according to the embodiment.
Figure 3:
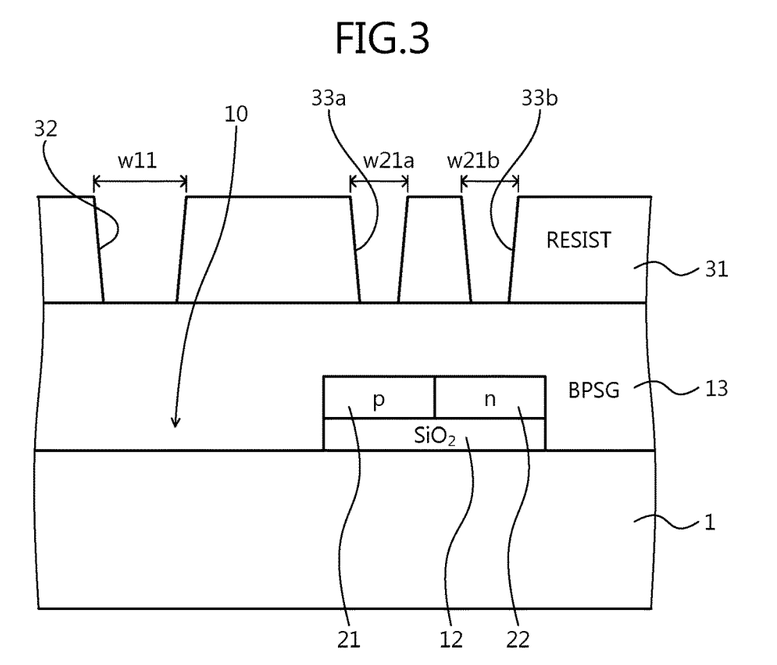
FIG. 3 is a cross-sectional view of the semiconductor device according to the embodiment during manufacture.

The method of manufacturing the semiconductor device according to the embodiment will be described. FIG. 2 is a flowchart depicting an outline of the method of manufacturing the semiconductor device according to the embodiment. FIGS. 3, 4, 5, 6, 7, and 8 are cross-sectional views of the semiconductor device according to the embodiment during manufacture. In FIGS. 3 to 8, the MOS gate region (refer to FIG. 1) constituted by the p-type base region 3, the $n^+$-type emitter region 4, the $p^+$-type contact region 5, the gate trench 6, the gate insulating film 7 and the gate electrode 8 of the trench gate type IGBT 10 is not depicted. First, as depicted in FIG. 3, at the front surface side of the semiconductor substrate (semiconductor wafer) 1 containing, for example, silicon, front surface element structures such as MOS gate region (not depicted) of the trench gate type IGBT 10 are formed (step S1).

Next, on the front surface of the semiconductor substrate, for example, by a thermal oxidation method or a chemical vapor deposition (CVD) method, the insulating layer 12 is selectively formed using a silicon oxide ($SiO_2$), etc. Next, on the insulating layer 12, poly-silicon layers 21, 22 constituting the p-type anode layer and the n-type cathode layer of the poly-silicon diode 20 are formed (step S2). The poly-silicon layers 21, 22 may be respectively formed by ion plantation of a p-type impurity and an n-type impurity after a non-doped poly-silicon is deposited by a CVD method. The poly-silicon layers 21, 22 may be respectively formed by depositing a doped poly-silicon of a p-type and n-type by a CVD method, etc.

Next, the interlayer insulating film 13 is formed on the entire front surface of the semiconductor substrate 1, for example, by a CVD method, so as to cover the gate electrode (not depicted) of the trench gate type IGBT 10 and the poly-silicon layers 21, 22 (step S3). Next, by heat treatment (reflow), chemical mechanical polishing (CMP), etc., the interlayer insulating film 13 is planarized, enhancing coverage (step coverage) of a front electrode (step S4). Next, on the interlayer insulating film 13, a resist film 31 is formed having predetermined regions opened (step S5).

The resist film 31 has openings 32, 33a, 33b at parts corresponding to a formation region of the contact hole 9 for a trench contact of the trench gate type IGBT 10 and formation regions of the contact holes 23a, 23b for the anode contact and the cathode contact of the poly-silicon diode 20. In the resist film 31, a width w11 of the opening (second opening) 32 corresponding to the formation region of the contact hole 9 for a trench contact of the trench gate type IGBT 10 is wider than widths w21a, w21b of the openings (first opening) 33a, 33b in the resist film 31 and corresponding to the formation regions of the contact holes 23a, 23b for the poly-silicon diode 20.

Figure 4:
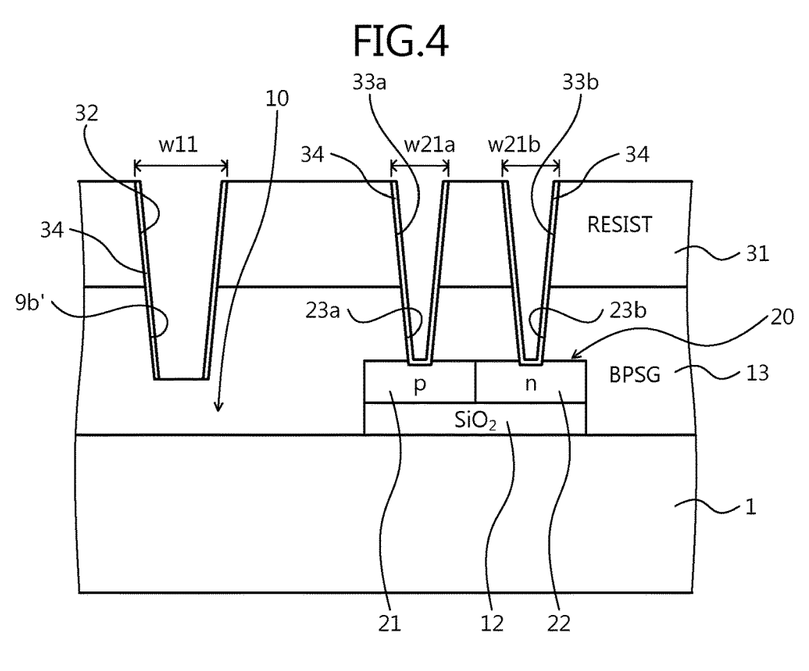
FIG. 4 is a cross-sectional view of the semiconductor device according to the embodiment during manufacture.

Next, as depicted in FIG. 4, dry etching is performed using the resist film 31 as a mask, and the interlayer insulating film 13 is selectively removed (step S6). The dry etching at step S6 is performed using, for example, a fluorine (F) based gas (second gas) such as a trifluoromethane ($CHF_3$) gas, a tetrafluoromethane ($CR$ gas, etc., and is performed utilizing F radicals in plasma generated in a chamber (furnace). By the dry etching at step S6, at parts exposed at the openings 33a, 33b of the resist film 31, the contact holes (first contact holes) 23a, 23b are respectively formed having a depth (first depth) so as to penetrate the interlayer insulating film 13 in the depth direction and respectively reach the poly-silicon layers 21, 22. As a result, the contact holes 23a, 23b for the poly-silicon diode 20 are formed.

Further, by the dry etching at step S6, the interlayer insulating film 13 is etched at a part exposed at the opening 32 of the resist film 31, and a contact hole (second contact hole) 9b' having a second depth is formed in the opening 32 of the resist film 31 concurrently with the contact holes 23a, 23b. As described, in the resist film 31, the width w11 of the opening 32 is wider than the widths w21a, w21b of the openings 33a, 33b. Therefore, a depth of the contact hole 9b' formed in the opening 32 of the resist film 31 is deeper than the depth of the contact holes 23a, 23b formed in the openings 33a, 33b of the resist film 31.

Next, at the time point when the depth of the contact holes 23a, 23b formed in the openings 33a, 33b of the resist film 31 reach the surfaces of the poly-silicon layers 21, 22, a gas species supplied in the chamber is switched to, for example, a fluorocarbon (CxFy, x, y: integer) based gas (first gas) such as an octafluorocyclobutane ($C_4F_8$) gas (step S7). At the time of processing at step S7, until the gas species in the chamber is completely switched to a CxFy based gas, the interlayer insulating film 13 is etched by the F based gas remaining in the chamber. Therefore, after the processing at step S7, the poly-silicon layers 21, 22 may be respectively exposed at the bottoms of the contact holes 23a, 23b. In other words, at the time of the dry etching at step S6, the processing at step S7 may be performed at an earlier timing before the time point when the depth of the contact holes 23a, 23b formed in the openings 33a, 33b of the resist film 31 reaches the surfaces of the poly-silicon layers 21, 22.

Figure 5:
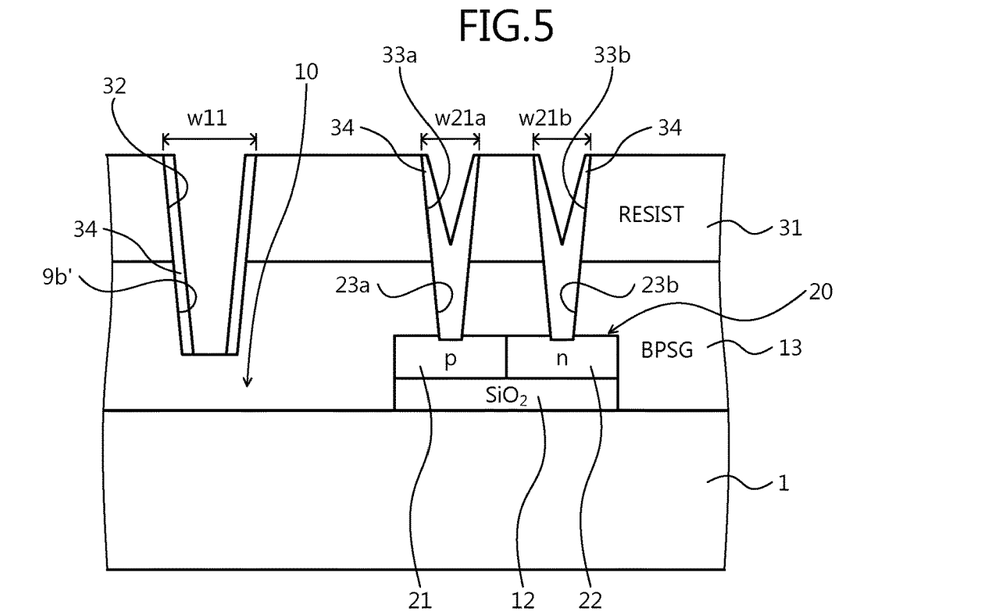
FIG. 5 is a cross-sectional view of the semiconductor device according to the embodiment during manufacture.

Next, using the CxFy based gas switched to at the step S7, by dry etching by CxFy radicals in the plasma generated in the chamber, a polymer (polymer from the CxFy radicals) 34 from the CxFy based gas is deposited (step S8). The polymer 34 is a reaction product produced by a constituent included in the gas supplied at the time of the processing at step S8. At step S8, as depicted in FIG. 5, the contact holes 23a, 23b formed in the openings 33a, 33b of the resist film 31 are embedded with the polymer 34.

At step S8, the contact holes 23a, 23b are embedded with the polymer 34, the side walls of the contact holes 23a, 23b and the surfaces of the poly-silicon layers 21, 22 exposed in the contact holes 23a, 23b are completely protected by the polymer 34 and etching of the interlayer insulating film 13 exposed in the openings 33a, 33b of the resist film 31 is ended. The polymer 34 is embedded in the contact holes 23a, 23b to an extent that at later-described processes at steps S10, S12, the poly-silicon layers 21, 22 and the interlayer insulating film 13 exposed in the openings 33a, 33b of the resist film 31 are not dry etched.

The contact hole 9b' formed in the opening 32 of the resist film 31 is designed to have the width w1 (refer to FIG. 1) by which the polymer 34 deposited by the processing at step S8 does not fill the contact hole 9b'. Therefore, at an inner wall (for example, side wall) of the contact hole 9b' formed in the opening 32 of the resist film 31, the polymer 34 is deposited to an extent that does not inhibit progress of dry etching at steps S10, S12 described hereinafter. Next, the gas species supplied in the chamber is again switched to, for example, an F based gas (third gas) such as a $CHF_3$ gas, a $CF_4$ gas, etc. (step S9). The resist film 31 is used as a mask, and the interlayer insulating film 13 exposed in the opening 32 of the resist film 31 is again etched by dry etching utilizing F radicals in the plasma generated in the chamber (step S10). Conditions of the dry etching at step S10 may be, for example, similar to the conditions of the dry etching at step S6.

Figure 6:
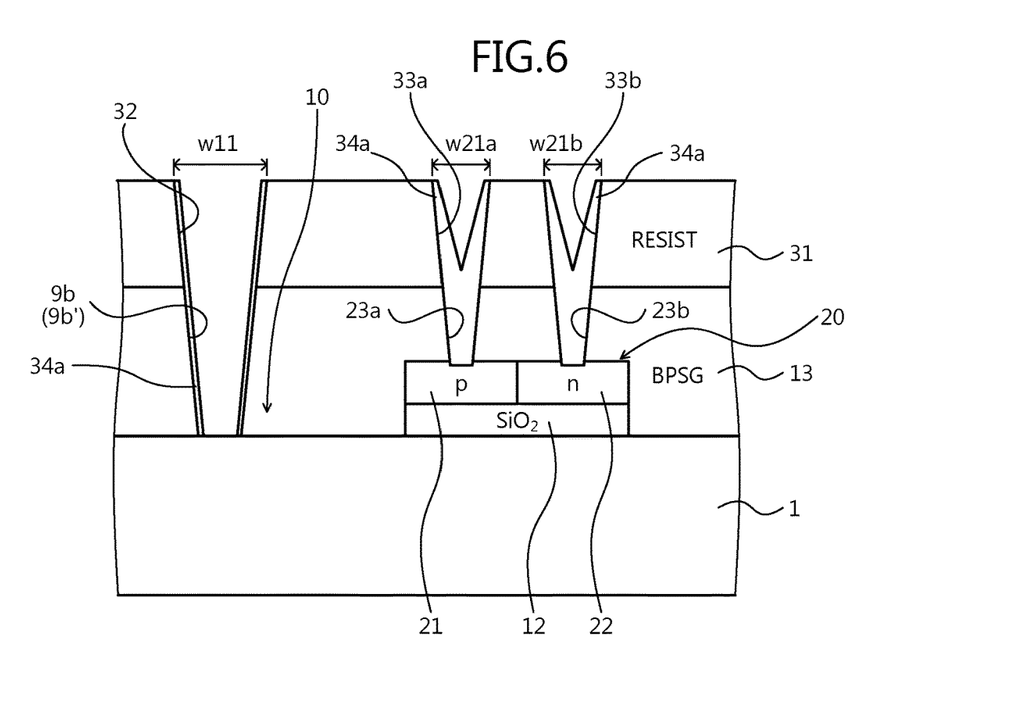
FIG. 6 is a cross-sectional view of the semiconductor device according to the embodiment during manufacture.
Figure 7:
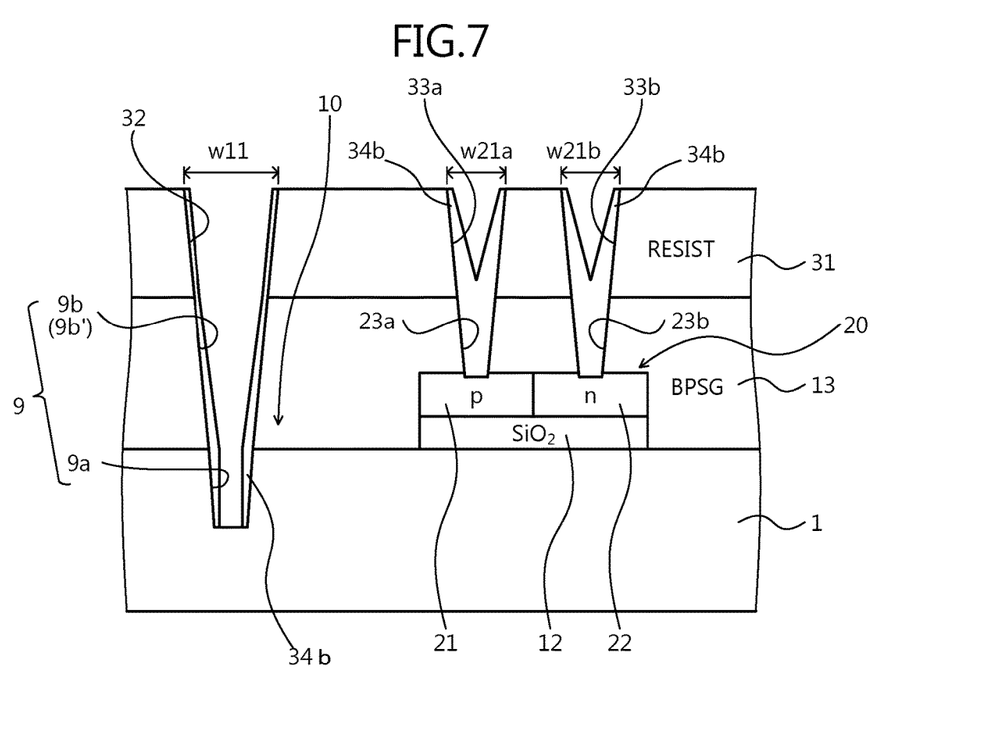
FIG. 7 is a cross-sectional view of the semiconductor device according to the embodiment during manufacture.

By the dry etching at step S10, the depth of the contact hole 9b' (third depth) formed in the opening 32 of the resist film 31 is increased and as depicted in FIG. 6, the contact hole 9b is formed penetrating the interlayer insulating film 13 in the depth direction and reaching the front surface of the semiconductor substrate 1. At this time, as described above, the polymer 34 is embedded in the contact holes 23a, 23b formed in the openings 33a, 33b of the resist film 31, and the side walls of the contact holes 23a, 23b and surfaces of the poly-silicon layers 21, 22 exposed in the contact holes 23a, 23b are protected by the polymer 34. Therefore, the poly-silicon layers 21, 22 and the interlayer insulating film 13 exposed in the openings 33a, 33b of the resist film 31 are not dry etched. Provided the polymer 34 embedded in the contact holes 23a, 23b is left to an extent that the interlayer insulating film 13 and the poly-silicon layers 21, 22 exposed in the openings 33a, 33b of the resist film 31 are not etched by the dry etching at step S12 described hereinafter, the polymer 34 may be slightly removed by the dry etching at step S10. In FIG. 6, the polymer 34 that remains after the dry etching at step S10 is indicated by reference character 34a. In FIG. 7, the polymer 34 that remains after the dry etching at step S12 is indicated by reference character 34b.

Next, the gas species supplied in the chamber is switched to, for example, a F based gas such as a $SF_6$ gas, a chlorotrifluoromethane ($CClF_3$) gas, etc. (step S11). In the dry etching at step S12 described hereinafter, when it is possible to use the gas used in the dry etching at step S10, the process at step S11 may be omitted. As depicted in FIG. 7, the resist film 31 is used as a mask, the semiconductor substrate 1 (silicon region) at the part exposed in the opening 32 of the resist film 31 is dry etched utilizing F radicals in the plasma, and the emitter trench 9a is formed at a predetermined depth, contiguous with the contact hole 9b (step S12). As a result, the contact hole 9 for a trench contact is formed from the emitter trench 9a and the contact hole 9b.

Figure 8:
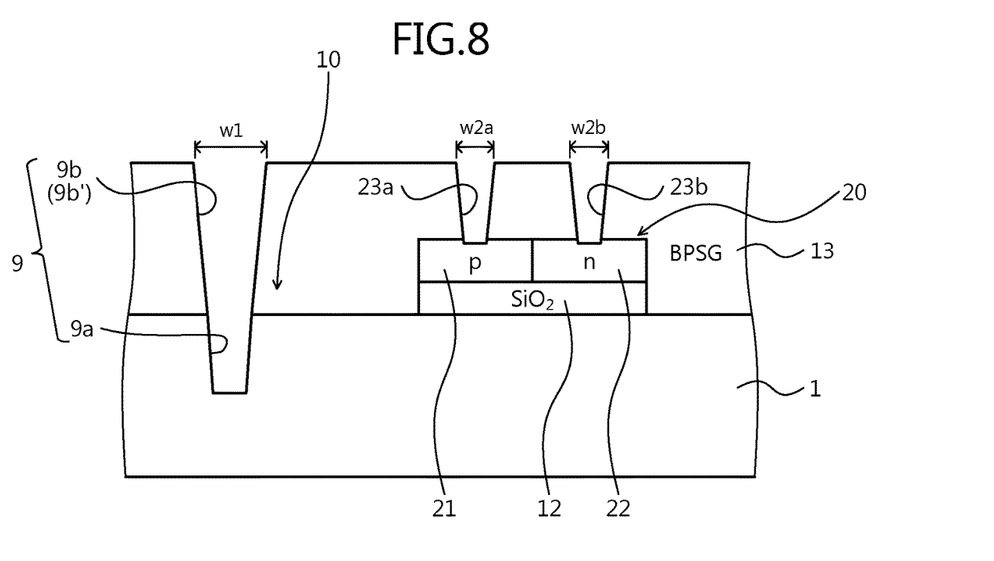
FIG. 8 is a cross-sectional view of the semiconductor device according to the embodiment during manufacture.

Next, as depicted in FIG. 8, the resist film 31 is removed by, for example, an ashing process that uses dissolution treatment and oxygen by chemical, peeling that uses an amine stripping solution, etc. (step S13). Next, the polymer 34b remaining in the contact holes 23a, 23b, 9b and the emitter trench 9a is lifted and removed (lifted off) by dissolution treatment by chemical solution (for example, SPM cleaning by sulfuric acid aqueous solution of hydrogen peroxide ($H_2SO_4/H_2O_2/H_2O$), SC1 cleaning by a mixed aqueous solution of $H_2O_2$ (hydrogen peroxide) and ammonia ($NH_3$)) (step S14).

For example, in the conventional technique (refer to FIGS. 9 to 15 and Published Japanese-Translation of PCT Application, Publication No. 2001-505001) using an ordinary Bosch process, the etching process of etching the interlayer insulating film 103 and the semiconductor substrate 101 (silicon region) and the deposition process of depositing the polymer on the side walls of the contact hole 137 and protecting the side walls of the contact hole 137 are alternately repeated multiple times as one process, and the contact hole 137 having a predetermined depth is formed. The contact hole 137 is formed by a process different from that of the contact holes 133a, 133b having differing depths. In contrast, in the present invention, as described, at steps S6, S10, and S12, the etching process using the Bosch process is performed only once, and at step S8, the deposition process of the polymer 34 of the Bosch process is performed only once.

In the contact holes 23a, 23b formed at step S6, the polymer 34 is embedded at step S8 thereafter. Therefore, the contact holes 23a, 23b formed at a predetermined depth by only the dry etching at step S6 and the contact hole 9 formed at a predetermined depth by all of the dry etching at steps S6, S10, S12 performed before and after step S8 may be formed concurrently using only one resist mask (the resist film 31). In addition, without removing the semiconductor substrate 1 from the chamber, the dry etching processes at steps S6, sS10, and S12 performed before and after step S8 may be performed continuously by merely switching the gas species at steps S7 and S11.

The timing at which the gas species at steps S7 and S11 is switched, for example, may be determined based on etching times respectively calculated from dry etching conditions (etching rate, etc.) for steps S6 and S10. Further, the timing at which the gas species at steps S7 and S11 is switched may be determined based on the emission intensity of observable plasma at the time of the dry etching at steps S6 and S10.

Next, at the entire front surface of the semiconductor substrate 1, the electrode layer (not depicted) is formed so as to be embedded in the contact holes 9, 23a, 23b. Next, by photolithography and etching, the electrode layer is patterned, whereby parts thereof embedded in the contact holes 9, 23a, 23b are left as the emitter electrode 14, the anode electrode 24a, and the cathode electrode 24b, respectively. As a result, at the inner wall of the emitter trench 9a constituting the contact hole 9, an emitter contact of the emitter electrode 14 with the $n^+$-type emitter region 4 and the $p^+$-type contact region 5 is formed. At the bottom of the contact hole 23a, the anode contact of the p-type poly-silicon layer 21 and the anode electrode 24a is formed. At the bottom of the contact hole 23b, the cathode contact of the n-type poly-silicon layer 22 and the cathode electrode 24b is formed. Next, at the rear surface of the semiconductor substrate 1, the $p^+$-type collector region 15 and the collector electrode 16 are formed. Thereafter, the semiconductor substrate 1 is diced into individual chips, completing the semiconductor device depicted in FIG. 1.

In the method of manufacturing the semiconductor device according to the embodiment, step S12 may be omitted. In a case where step S12 is omitted, a semiconductor device may be fabricated (manufacture) having an ordinary emitter contact formed by an emitter contact of the emitter electrode with the $n^+$-type emitter region and the $p^+$-type contact region, on the front surface of the semiconductor substrate 1. Further, a contact hole (not depicted) for leading out to the chip surface and connecting the gate electrode 8 of the trench gate type IGBT 10 with a gate runner or a gate pad (electrode pad), etc. may be formed concurrently with the contact holes 9, 23a, 23b.

The contact hole for leading out the gate electrode 8 of the trench gate type IGBT 10, to the chip front surface may be formed in an active region, or may be formed in an edge termination region surrounding a periphery of the active region. The active region is a region through which current flows in an ON state (region responsible for current driving). The edge termination region is a region between the active region and an outside surface of the semiconductor substrate (semiconductor chip) 1, and is a region that mitigates electric field at a substrate front surface (the front surface of the semiconductor substrate 1) side of the $n^-$-type drift region 2 and maintains the breakdown voltage. The breakdown voltage is a voltage limit that does not cause malfunction or destruction of an element.

Further, in place of the trench gate type IGBT 10 in which a MOS gate is embedded in the gate trench 6 formed in the semiconductor substrate 1, a planar gate type IGBT (not depicted) having a planar MOS gate on a semiconductor substrate may be formed. Depths of the contact holes for the emitter contact and the gate contact of the planar gate type IGBT mutually differ and therefore, the method of manufacturing the semiconductor device according to the embodiment may be applied, enabling the contact holes for the emitter contact and a gate contact of the planar gate type IGBT to be formed concurrently.

Further, by using a mixed gas of a CxFy based gas and an F based gas, and optimizing dry etching conditions based on depths of contact holes that are to have relatively shallow depths, so that the contact holes that are to have relatively the shallow depths alone are embedded with the polymer, the switching of the gas species at steps S7 and S9 may be omitted. In this case, the dry etching at step S6, for example, is performed with a $CHF_3$ gas at a flow rate of 40 ml/min. and a $C_4F_8$ gas at a flow rate of 10 ml/min. in the chamber, and by using a mixed gas generating plasma by a current of 400 W. The deposition of the polymer 34 at step S8, for example, is performed with a $CHF_3$ gas at a flow rate of 10 ml/min. and a $C_4F_8$ gas at a flow rate of 40 ml/min. in the chamber, and by using a mixed gas generating plasma by a current of 400 W. The dry etching at step S10, for example, is performed with a $CHF_3$ gas at a flow rate of 40 ml/min. and a $C_4F_8$ gas at a flow rate of 10 ml/min. in the chamber, and by using a mixed gas generating plasma by a current of 400 W.

In place of silicon, silicon carbide (SiC) may be used as a material of the semiconductor substrate 1. When silicon carbide is used as a material of the semiconductor substrate 1, the gas species used in the dry etching at steps S6 and S10 may be, for example, $CF_4$, $CHF_3$, etc. The gas species used in the dry etching at step S12 may be, for example, $SF_6$, $CClF_3$, etc. The gas species supplied in the chamber at step S7 may be, for example, silicon tetrafluoride ($SiF_4$)+oxygen ($O_2$), etc.

As described, according to the embodiment, the interlayer insulating film is dry etched using, as a mask, a resist film having openings that correspond to formation regions of contact holes formed at differing depths. After the depths of contact holes that are to have relatively shallow depths reach a predetermined depth, the gas species supplied in the chamber is switched and a deposition process of a polymer by a Bosch process is used to deposit the polymer, whereby the contact holes that are to have relatively shallow depths are embedded with the polymer. At this time, in the resist film, the widths of the openings corresponding to the formation regions of the contact holes that are to have relatively deep depths are wider than the widths of the openings corresponding to the formation regions of the contact holes that are to have relatively shallow depths. Therefore, the contact holes that are to have relatively deep depths are not filled with the polymer. In a state where the contact holes that are to have relatively shallow depths are embedded with the polymer, the gas species supplied in the chamber is switched and the interlayer insulating film is dry etched using the same resist film, whereby the contact holes that are to have relatively deep depths are formed to a predetermined depth.

For example, in the conventional technique (refer to FIGS. 9 to 15), a resist mask (resist film) is formed for each contact hole having a different depth. In particular, in the conventional technique, two sessions of the photolithographic process for forming the resist films 131, 135 are necessary. In contrast, according to the embodiment, as described, by only switching the gas species supplied in the chamber and using only one resist mask without removing the semiconductor substrate (semiconductor wafer) from the chamber, contact holes of differing depths may be formed. Therefore, compared to the conventional technique, the number of processes may be reduced. Further, costs (material costs, etc.) may be reduced and the time required for resist mask formation (one session of the photolithographic process requires about 1 hour) and for resist mask removal may be reduced. Therefore, in forming the contact holes having differing depths, reductions in cost and lead time may be realized. In particular, for example, when the etching rates are the same, depending on the product, one less session of the photolithographic process is performed and therefore, a time reduction of about 3 to 5% is possible compared to the conventional technique.

Further, according to the embodiment, at each of the etching processes performed before and after the polymer deposition process, degrees of freedom in the depths of the contact holes that are to have relatively shallow depths and in the depth of the contact holes that are to have relatively deep depths may be adjusted. Further, in the conventional technique, when contact holes having differing depths are formed, a resist film used as an etching mask for forming one contact hole is embedded in other contact holes already formed. Therefore, resist residue remains in the other contact holes and may lead to poor contact. In contrast, according to the embodiment, since one resist film is used to form the contact holes of differing depths, the resist film is not embedded in contact holes. Therefore, the occurrence of poor contact due to resist residue in the contact hole may be prevented.

Further, in the conventional technique, the process of etching the interlayer insulating film and the process of depositing the polymer at the side walls of the contact holes and protecting the side walls of the contact holes are alternately repeated. Therefore, depending on the process conditions of the Bosch process, during the Bosch process, contact holes are embedded with the polymer (etching stop), impeding formation of the contact holes. Further, polymer that is incompletely removed due to etching stop remains at the bottom of the contact holes, whereby the silicon and the electrode layer, and/or the gate electrode and the electrode layer are not connected. As a result, poor characteristics or reduced reliability occur. In contrast, according to the embodiment, only one session of the polymer deposition process for embedding polymer in the contact holes that are to have relatively shallow depths is performed and therefore, etching stop of the contact holes that are to have relatively deep depths does not occur.

Without limitation to the embodiment, various modifications within a range not departing from the spirit of the present invention are possible. For example, in the embodiment, while an IGBT has been described as an example, a MOSFET or a diode formed by a pn junction of a p-type diffusion region and an n-type diffusion region may replace the IGBT. The present invention is similarly implemented when conductivity types (n-type, p-type) are reversed.

According to the embodiment of the present invention, contact holes having differing depths may be formed using only one resist film and without removing the semiconductor substrate from the chamber (furnace).

The method of manufacturing a semiconductor device according to the embodiment of the present invention achieves an effect in that in the formation of contact holes having differing depths, reductions in cost and lead time may be realized.

As described, the method of manufacturing a semiconductor device according to the embodiment of the present invention is useful for semiconductor devices that have contact holes having differing depths.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device having a plurality of contact holes of differing depths, the method comprising:
   (a) forming an interlayer insulating film on a semiconductor substrate;
   (b) forming on the interlayer insulating film, a resist film having a first opening and a second opening having a width that is greater than a width of the first opening;
   (c) dry etching the interlayer insulating film using the resist film as a mask, to concurrently form a first contact hole and a second contact hole, wherein
   the step (c) further includes
      forming the first contact hole at the first opening in which a part of the interlayer insulating film is exposed, the first contact hole having a first depth, and forming the second contact hole at the second opening in which a part of the interlayer insulating film is exposed, the second contact hole having a second depth;

(d) depositing a reaction product produced from a first gas, so as to embed the reaction product in the first contact hole;

(e) after the step (d), further dry etching, with the reaction product embedded in the first contact hole, the interlayer insulating film, thereby to extend the depth of the second contact hole from the second depth to a third depth, the third depth being greater than the first depth of the first contact hole;

(f) removing the resist film; and (g) removing the reaction product and exposing the first contact hole.

2. The method according claim 1, wherein
the step (c) includes introducing a second gas into a chamber to perform the dray etching,
the step (d) includes introducing a first gas into the chamber to depositing the reaction product, the method further comprising
switching a gas to be introduced into the chamber from the second gas to the first gas, after the step (c) and before the step (d).

3. The method according to claim 2, further comprising
switching a gas to be introduced into the chamber from the first gas to a third gas, after the step (d) and before the step (e).

4. The method according to claim 3, wherein the second gas and the third gas contain—a same gas species.

5. The method according to claim 1, wherein
the step (c) includes dry etching the interlayer insulating film using a mixed gas containing the first gas,
the step (d) includes introducing the mixed gas containing the first gas, and depositing the reaction product produced from the mixed gas, and
the step (e) includes dry etching the interlayer insulating film using the mixed gas.

6. The method according to claim 1, further comprising:
forming a poly-silicon layer disposed on the semiconductor substrate; and
forming in the first contact hole, a first electrode layer that forms a contact with the poly-silicon layer after the step (g), wherein
the step (c) includes making the first depth of the first contact hole a depth that reaches a surface of the poly-silicon layer disposed on the semiconductor substrate.

7. The method according to claim 1, wherein
the step (f) includes making the third depth of the second contact hole a depth that reaches a surface of the semiconductor substrate, and
the method further comprising
forming in the second contact hole, a second electrode layer that forms a contact with the semiconductor substrate after the step (g).

8. The method according to claim 7, further comprising
dry etching the semiconductor substrate using the resist film as a mask after the step (e) and before the step (g), thereby further increasing the depth of the second contact hole, wherein
forming the second electrode layer includes forming at a side wall of the second contact hole, a contact of the semiconductor substrate and the second electrode layer.

9. A method of manufacturing a semiconductor device having a plurality of contact holes of differing depths, the method comprising:

(a) forming an interlayer insulating film on a semiconductor substrate;

(b) forming on the interlayer insulating film, a resist film having a first opening and a second opening having a width that is greater than a width of the first opening;

(c) introducing one gas in a chamber to dry etch the interlayer insulating film using the resist film as a mask, so as to
form at the first opening in which a part of the interlayer insulating film is exposed, a first contact hole having a first depth, and
form at the second opening in which a part of the interlayer insulating film is exposed, a second contact hole having a second depth;

(d) after step (c), switching a gas to be introduced into the chamber from the one gas to an other gas, thereby to produce a reaction product to be embedded in the first contact hole;

(e) after the step (d), further dry etching, with the reaction product embedded in the first contact hole, the interlayer insulating film, thereby to extend the depth of the second contact hole from the second depth to a third depth, the third depth being greater than the first depth of the first contact hole;

(f) removing the resist film; and (g) removing the reaction product and exposing the first contact hole.

* * * * *